(12) United States Patent
Chehade et al.

(10) Patent No.: US 10,897,837 B1
(45) Date of Patent: Jan. 19, 2021

(54) COOLING ARRANGEMENT FOR A SERVER MOUNTABLE IN A SERVER RACK

(71) Applicant: OVH, Roubaix (FR)

(72) Inventors: Ali Chehade, Templeuve (FR); Hadrien Bauduin, Villeneuve d'Ascq (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 17/002,065

(22) Filed: Aug. 25, 2020

(30) Foreign Application Priority Data

Nov. 29, 2019 (EP) .................................... 19315149

(51) Int. Cl.
*H05K 7/20* (2006.01)
(52) U.S. Cl.
CPC ................... *H05K 7/20818* (2013.01)
(58) Field of Classification Search
CPC ............ H05K 7/20781; H05K 7/203; H05K 7/20418; H05K 7/20663; H05K 7/20681; H05K 7/20809; H05K 7/20818
See application file for complete search history.

(56) References Cited

U.S. PATENT DOCUMENTS

| | | | |
|---|---|---|---|
| 6,141,211 A * | 10/2000 | Strickler | G06F 1/184 361/679.31 |
| 6,796,372 B2 | 9/2004 | Bear | |
| 6,828,675 B2 | 12/2004 | Memory et al. | |
| 6,836,407 B2 | 12/2004 | Faneuf et al. | |
| 7,012,807 B2 | 3/2006 | Chu et al. | |
| 7,133,283 B2 | 11/2006 | Faneuf et al. | |
| 7,233,491 B2 | 6/2007 | Faneuf et al. | |
| 7,333,334 B2 | 2/2008 | Yamatani et al. | |
| 7,539,020 B2 | 5/2009 | Chow et al. | |

(Continued)

FOREIGN PATENT DOCUMENTS

| | | |
|---|---|---|
| CN | 104252187 B | 8/2016 |
| CN | 105704989 B | 9/2018 |

(Continued)

OTHER PUBLICATIONS

European Search Report with regard to the counterpart European Patent Application No. 19315149.5 completed Apr. 17, 2020.

(Continued)

*Primary Examiner* — Abhishek M Rathod
(74) *Attorney, Agent, or Firm* — BCF LLP

(57) ABSTRACT

A cooling arrangement for a server mountable in a server rack comprises a phase change device and a fluid cooling unit. The phase change device includes an evaporator mountable on a heat-generating unit of the server, a condenser disposed outside of the server, and conduits extending laterally from the server, between the evaporator and the condenser. The conduits carry a working fluid heated in the evaporator to the condenser. The working fluid is cooled in the condenser before returning to the evaporator. The fluid cooling unit is positioned along the server rack and receives a cooling fluid from an external cooling facility. A heat transfer module of the fluid cooling unit has an open channel for slidably receiving the condenser. The cooling fluid flows in a water jacket surrounding the open channel. Heat is transferred from the condenser to the cooling fluid flowing in the water jacket.

13 Claims, 8 Drawing Sheets

(56) References Cited

U.S. PATENT DOCUMENTS

| | | |
|---|---|---|
| 7,826,217 B2 | 11/2010 | Kondo et al. |
| 7,958,935 B2 | 6/2011 | Belits et al. |
| 8,164,901 B2 | 4/2012 | Neudorfer |
| 8,582,298 B2 * | 11/2013 | Facusse .............. H05K 7/20809 361/710 |
| 8,934,245 B2 | 1/2015 | Yoshikawa |
| 9,074,825 B2 | 7/2015 | Satou et al. |
| 9,560,794 B2 | 1/2017 | Sato et al. |
| 9,605,907 B2 | 3/2017 | Sakamoto et al. |
| 9,625,962 B2 | 4/2017 | Hayashi et al. |
| 9,829,253 B2 | 11/2017 | Mishkinis et al. |
| 10,045,466 B1 | 8/2018 | Chen et al. |
| 2006/0187639 A1 | 8/2006 | Carswell |
| 2007/0291452 A1 | 12/2007 | Gilliland et al. |
| 2008/0043442 A1 | 2/2008 | Strickland et al. |
| 2009/0154104 A1 | 6/2009 | Kondo et al. |
| 2012/0279683 A1 | 11/2012 | Arney et al. |
| 2014/0321050 A1 * | 10/2014 | Sato .......................... G06F 1/20 361/679.47 |
| 2015/0208551 A1 | 7/2015 | Davidson |
| 2016/0044833 A1 * | 2/2016 | Krishnan ........... H05K 7/20818 361/679.53 |
| 2019/0166725 A1 | 5/2019 | Jing et al. |

FOREIGN PATENT DOCUMENTS

| | | |
|---|---|---|
| EP | 3490357 A1 | 5/2019 |
| JP | 2010212533 A | 9/2010 |
| WO | 2013/089162 A1 | 6/2013 |
| WO | 2019/077827 A1 | 4/2019 |

OTHER PUBLICATIONS

English Translation of JP2010212533 retrieved on EPO site on Apr. 21, 2020.

English Abstract for CN105704989 retrieved on Espacenet on Aug. 19, 2020.

English Abstract for CN104252187 retrieved on Espacenet on Aug. 19, 2020.

* cited by examiner

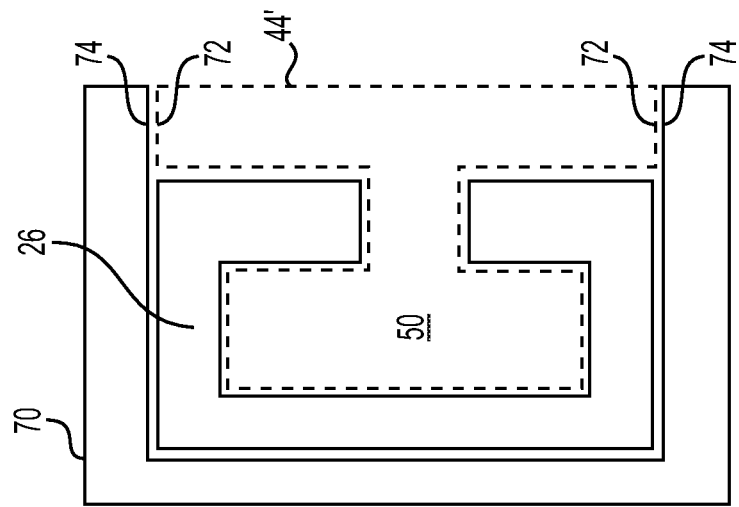
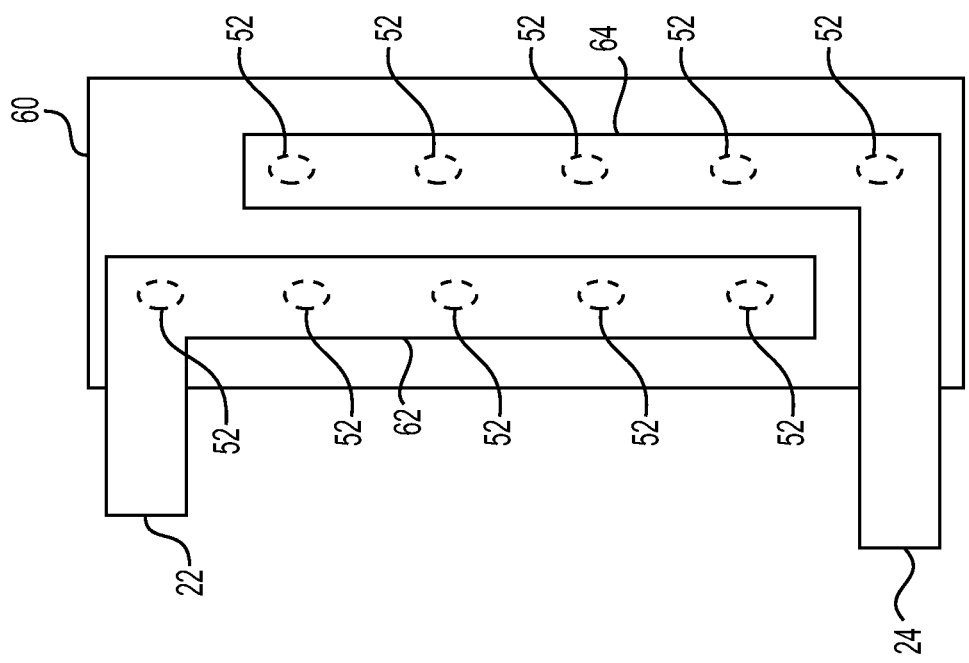
FIG. 8
FIG. 9

COOLING ARRANGEMENT FOR A SERVER MOUNTABLE IN A SERVER RACK

CROSS-REFERENCE

The present application claims priority from European Patent Application No. 19315149.5, filed on Nov. 29, 2019, the entirety of which is incorporated herein by reference.

FIELD

The present technology relates to cooling techniques for electronic equipment. In particular, a cooling arrangement for a server mountable in a server rack is disclosed.

BACKGROUND

Electronic equipment, for example servers, memory banks, computer discs, and the like, is conventionally grouped in equipment racks. Large data centers and other large computing infrastructures may contain thousands of racks supporting thousands or even tens of thousands of servers.

The equipment mounted in the racks consumes large amounts of electric power and generate significant amounts of heat. Cooling needs are important in such racks. Some electronic devices, such as processors, generate so much heat that they could fail within seconds in case of a lack of cooling.

Forced air-cooling has been traditionally used to disperse heat generated by processors and other heat-generating components of servers mounted in server racks. Air-cooling requires the use of powerful fans, the provision of space between servers or between components of a server for placing heat sinks and for allowing sufficient airflow, and is generally not very efficient.

Water-cooling technologies, for example using water-cooling, is increasingly used to as an efficient and cost-effective solution to preserve safe operating temperatures of servers and like equipment mounted in racks. Water-cooling units, for example so-called water blocks, are mounted on heat-generating components, such as processors. Heat is absorbed by water flowing between these water-cooling units and heat exchange components located outside of the racks. The heated water flows from these water-cooling units to external, larger cooling units. Although quite efficient, the performance of water-cooling technology is limited by the specific heat capacity of water and by the available contact area between these heat-generating components and water-cooling units. The limited heat transfer area provided by typical processors and the specific heat capacity of water impose a limit on the effectiveness of water-cooling techniques.

Additionally, despite advances water-cooling technologies, some clients of large computing infrastructures are concerned about potential safety hazards caused by the presence of water in their servers and may be reluctant to the use of water-cooling solutions. This may particularly be the case when clients require large amounts of data to be stored in hard disks provided in their servers. Additionally, some clients have expressed concerns about potential long-term risks of corrosion of their equipment.

No matter the cooling technology used to maintain a safe temperature of processors, servers, and other equipment mounted in the racks of data centers and like computing infrastructures, various maintenance requirements also need to be considered when selecting a cooling technology. For example, servers may need to be inserted in and/or removed from racks on a regular basis, for maintenance and/or upgrade purposes. Electrical and data connections are usually relatively easy to handle when a server is inserted in a rack or removed from a rack. Safely connecting and disconnecting water-cooling equipment may cause considerably more complex difficulties. Many server racks include active components in their backplanes, for example hard disk drives, and there is a desire to provide easy access to these components. Access to server rack backplanes should be uncluttered from cooling components. Likewise, front areas of server racks are conventionally used for attaching network connection cables to servers and should be free from cooling components. The opposite is sometimes true as some racks include network connections in the backplane and hard disk drives on their front end. Regardless, the same conclusion remains that there is a desire to keep front ends and backplanes of some racks free from any cooling components.

Even though the recent developments identified above may provide benefits, improvements are still desirable.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art.

In particular, such shortcomings may comprise (1) limit on the effectiveness of water-cooling techniques; and/or (2) concerns related to safety hazards caused by the presence of water in their servers.

In one aspect, various implementations of the present technology provide a cooling arrangement for a server mountable in a server rack having a front side, a rear side, a bottom side, a top side, a first lateral side and a second lateral side opposite from the first lateral side, the cooling arrangement comprising:
  a phase change device, comprising:
    an evaporator adapted to be mounted on a heat-generating unit of the server,
    a condenser,
    a first conduit extending from the server to the first lateral side of the server rack, the first conduit being adapted to transport to the condenser a working fluid heated in the evaporator, and
    a second conduit extending from the server to the first lateral side of the server rack, the second conduit being adapted to return to the evaporator the working fluid cooled in the condenser; and
  a fluid cooling unit positioned along the first lateral side of the server rack, the fluid cooling unit comprising:
    a fluid inlet adapted to receive a cooling fluid from an external cooling facility,
    a fluid outlet adapted to return the cooling fluid to the external cooling facility, and
    a heat transfer module, comprising:
      an open channel parallel to the first lateral side of the server rack and adapted to slidably receive the condenser when the server is inserted in the server rack from a front side of the server rack, and a water jacket extending between the fluid inlet and the fluid outlet and surrounding at least in part the open channel, the heat transfer module being configured to allow a transfer of heat from the working fluid present in the evaporator to the cooling fluid present in the water jacket when the condenser is received in the open channel, the condenser having a H-shaped cross-section defined perpendicularly from a direction of insertion of the server in the server rack, the open channel having a C-shaped opening with top and bottom rails protruding within the C-shaped opening, the C-shaped opening and the top and bottom rails being adapted to mate with the H-shaped cross-section of the condenser when the condenser is received in the open channel.

In some implementations of the present technology, the cooling arrangement further comprises a casing containing a phase change material, PCM, the casing being thermally connected to the heat transfer module and to the condenser, the PCM changing from a solid state to a liquid state when a lack of flow of the cooling fluid in the water jacket causes a temperature of the PCM to increase above a phase change temperature of the PCM, the PCM changing from the liquid state to the solid state when a normal flow of the cooling fluid in the water jacket causes a temperature of the PCM to decrease to less than the phase change temperature of the PCM.

In some implementations of the present technology, the cooling arrangement further comprises a plurality of phase change devices, each phase change device comprising a respective evaporator adapted to be mounted on a heat-generating unit of a respective server, each phase change device further comprising a respective first conduit and a respective second conduit adapted to transport a working fluid between the respective evaporator and a respective condenser, the fluid cooling unit further comprising a plurality of heat transfer modules, each heat transfer module comprising a respective open channel being adapted to slidably receive a respective one of the condensers, and a respective water jacket extending between the fluid inlet and the fluid outlet.

In some implementations of the present technology, the plurality of heat transfer modules are vertically distributed along a lateral edge on the first lateral side of the server rack and adapted to receive the plurality of condensers in their respective open channels when the respective condensers of the plurality of phase change devices are mounted on a plurality of servers vertically distributed in the server rack.

In some implementations of the present technology, the fluid cooling unit further comprises a manifold connecting the fluid inlet and the fluid outlet to each of the water jackets.

In some implementations of the present technology, the server rack has a depth, the open channel has a length not exceeding the depth of the server rack, and the condenser has a length not exceeding the length of the open channel.

In some implementations of the present technology, the first conduit and the second conduit are heat pipes.

In some implementations of the present technology, the first conduit and the second conduit are adapted to protrude through a lateral slot on the first lateral side of the server rack.

In some implementations of the present technology, the cooling arrangement further comprises a sealing gasket positioned on a lateral edge on the first lateral side of the server rack, the sealing gasket being adapted to allow passage of the first conduit and the second conduit.

In some implementations of the present technology, the external cooling facility is a dry cooler.

In some implementations of the present technology, the working fluid is selected from water, distilled water, ammonia, pentane, methanol, ethanol, butanol and hydrofluorocarbon.

In some implementations of the present technology, the fluid inlet is a first fluid inlet adapted to receive a first cooling fluid, the fluid outlet is a first fluid outlet adapted to return the first cooling fluid, the water jacket is a first water jacket, the external cooling facility is a first external cooling facility, the fluid cooling unit further comprises a second fluid inlet adapted to receive a second cooling fluid from the first external cooling facility or from a second external cooling facility, a second fluid outlet adapted to return the second cooling fluid to the first external cooling facility or to the second external cooling facility, and a second water jacket extending between the second fluid inlet and the second fluid outlet and surrounding at least in part the open channel, and the heat transfer module is further configured to allow a transfer of heat from the working fluid present in the evaporator to the second cooling fluid present in the second water jacket when the condenser is received in the open channel.

In other aspects, various implementations of the present technology provide a cooling arrangement, comprising:

a first combination comprising a first phase change device and a first fluid cooling unit as defined hereinabove, a first evaporator of the first combination being thermally coupled to a first heat-generating unit of the server; and a second combination comprising a second phase change device and a second fluid cooling unit as defined hereinabove, a second evaporator of the second combination being thermally coupled to the first heat-generating unit of the server or to a second heat-generating unit of the server;

the first fluid cooling unit being positioned along the first lateral side of the server rack; and the second fluid cooling unit being positioned along the second lateral side of the server rack.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where:

FIG. 8 is schematic diagram of a manifold of the fluid cooling unit in accordance with an embodiment of the present technology; and FIG. 9 is a front elevation view of another heat transfer module of the fluid cooling unit and another condenser in accordance with an embodiment of the present technology.

Figure 1:
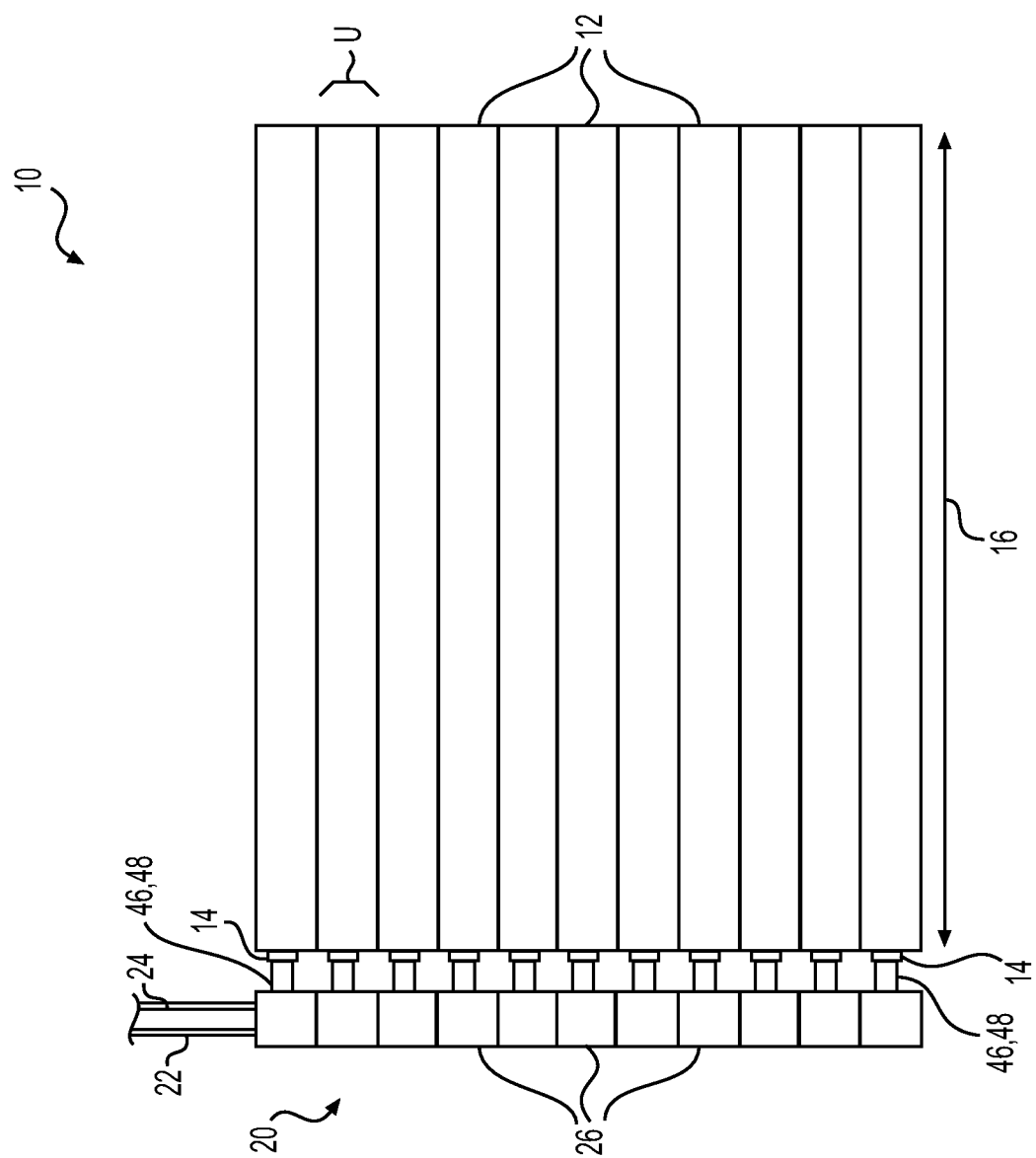
FIG. 1 is a front elevation view of a server rack and a fluid cooling unit in accordance with an embodiment of the present technology.

It should be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes that may be substantially represented in non-transitory computer-readable media and so executed by a computer or processor, whether or not such computer or processor is explicitly shown.

In an aspect, the present technology introduces a cooling arrangement using a phase change device including an evaporator to absorb heat from a heat-generating unit, for example a processor, of a server inserted in a server rack. The phase change device also includes a condenser inserted in a fluid cooling unit positioned outside of the server rack. Heat is transported from the evaporator to the condenser via conduits that contain a working fluid. Cooling is provided by a cooling fluid, for example water, supplied to the fluid cooling unit by an external cooling facility, for example a dry cooler. Heat is transferred from the evaporator to the fluid cooling unit. This cooling arrangement maintains the cooling fluid outside of the server rack. The working fluid may have a high specific latent heat of vaporization, allowing efficient cooling of the heat-generating unit.

With these fundamentals in place, we will now consider some non-limiting examples to illustrate various implementations of aspects of the present technology.

Figure 2:
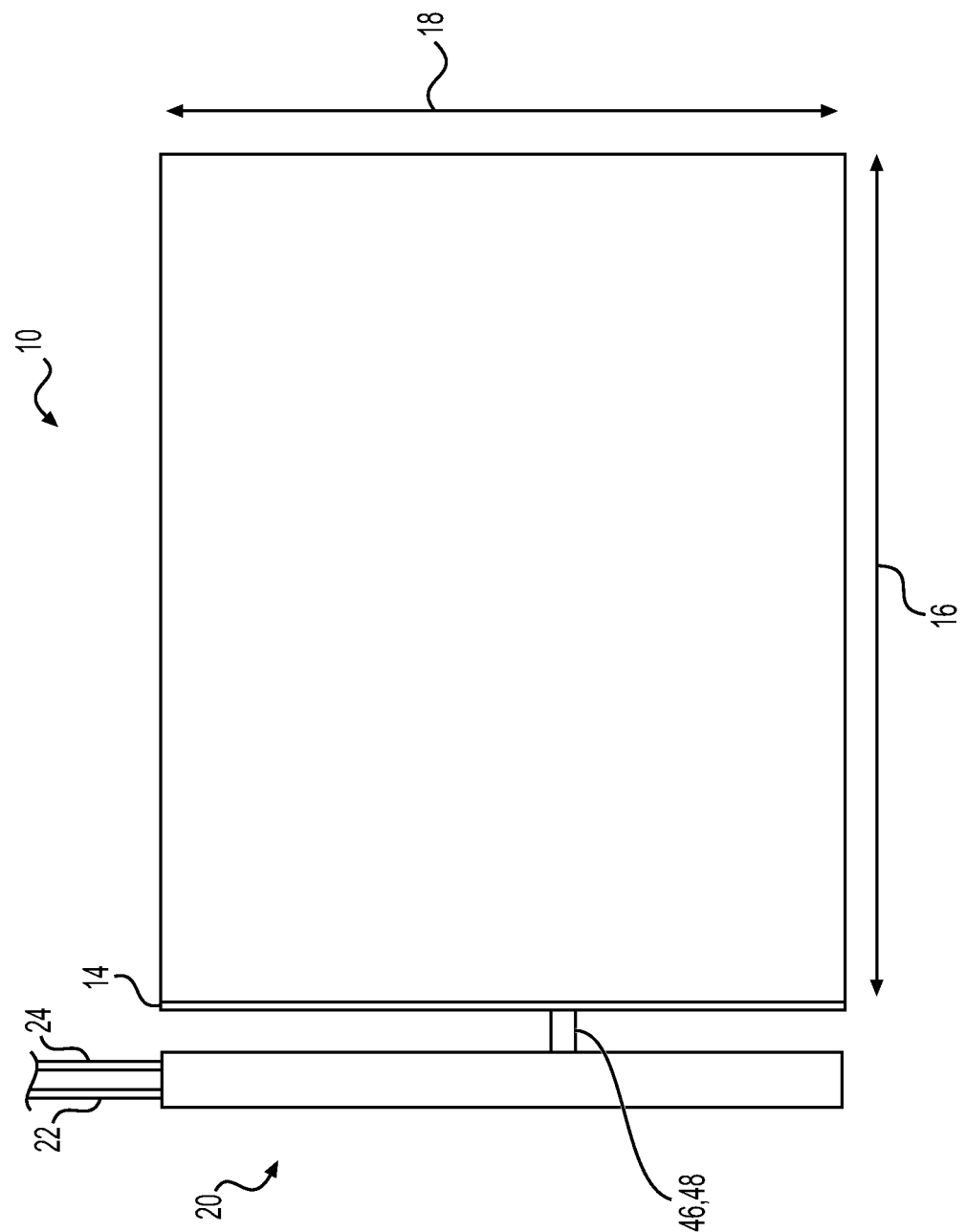
FIG. 2 is a top plan view of the server rack and the fluid cooling unit of FIG. 3 in accordance with an embodiment of the present technology.
Figure 3:
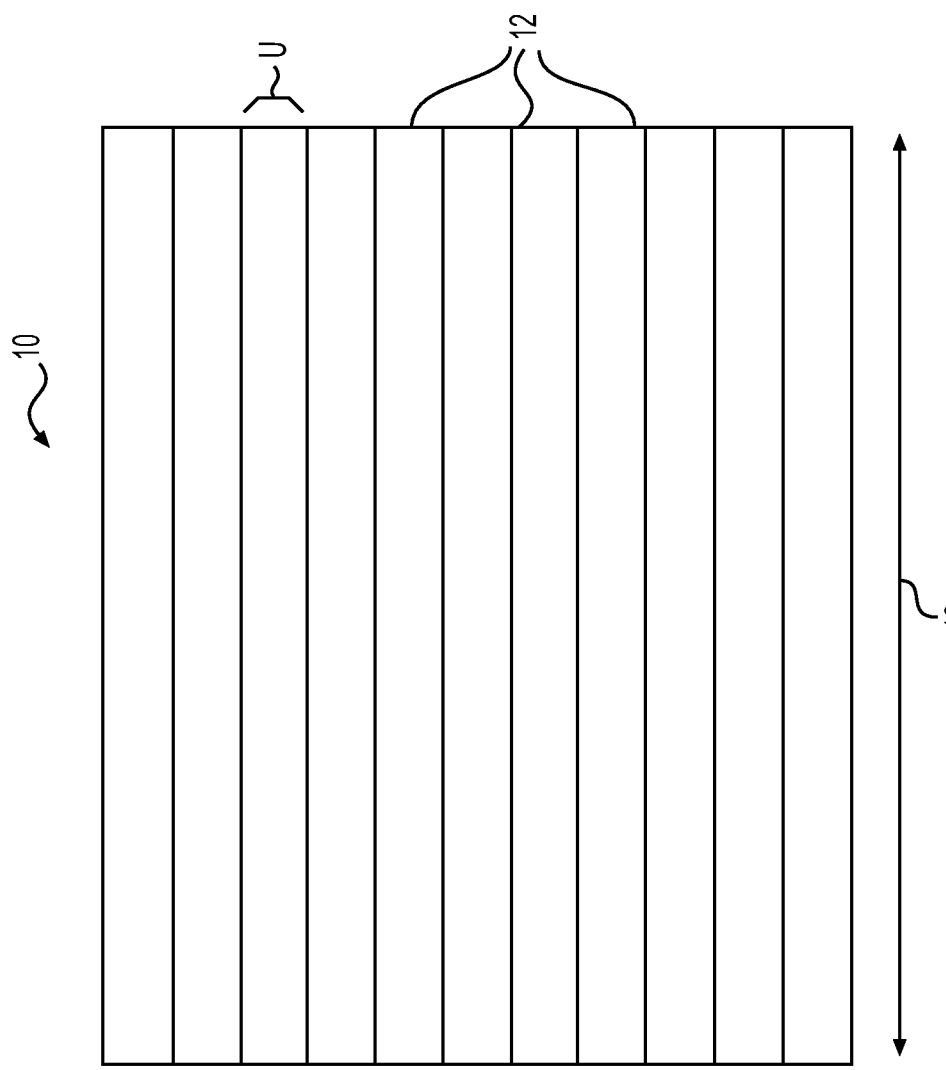
FIG. 3 is a left side elevation view of the server rack of FIG. 3 in accordance with an embodiment of the present technology.

FIG. 1 is a front elevation view of a server rack and a fluid cooling unit in accordance with an embodiment of the present technology. FIG. 2 is a top plan view of the server rack and the fluid cooling unit of FIG. 3 in accordance with an embodiment of the present technology. FIG. 3 is a left side elevation view of the server rack of FIG. 3 in accordance with an embodiment of the present technology. FIGS. 1, 2 and 3 show a server rack 10 having a plurality of stages 12. Each stage 12 has height equal to a standard-size rack unit "U". Each stage 12 has a width 16 and a depth 18 adapted to receive a standard-size server (shown on later Figures). Some servers have a height corresponding to one rack unit U and other servers have a height corresponding to a multiple of the rack unit U.

A fluid cooling unit 20 is positioned along a lateral side of the server rack 10. The fluid cooling unit 20 comprises a fluid inlet 22 that receives a cooling fluid, for example water, from an external cooling facility (not shown). A fluid outlet 24 of the fluid cooling unit 20 returns the cooling fluid to the external cooling facility. The orientation of the fluid inlet 22 and of the fluid outlet 24 as shown is for illustration purposes only. The fluid cooling unit 20 as shown comprises a plurality of heat transfer modules 26. In the embodiment as shown, a number of the heat transfer modules 26 corresponds to a number of the stages 12 of the server rack 10. The heat transfer modules 26 are vertically distributed along a lateral edge of the server rack 10.

Figure 4:
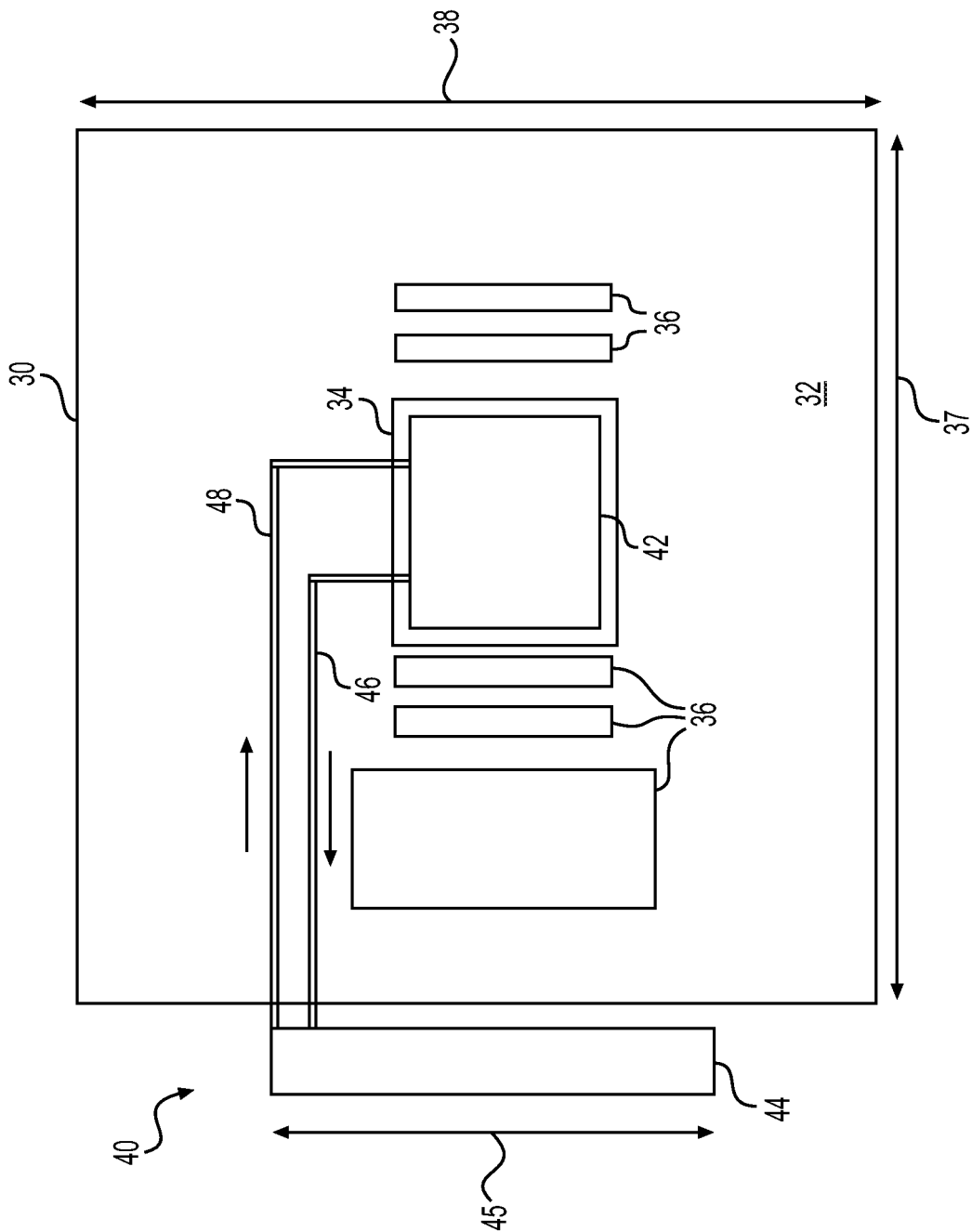
FIG. 4 is a top plan view of a server, an evaporator and a condenser in accordance with an embodiment of the present technology.
Figure 5:
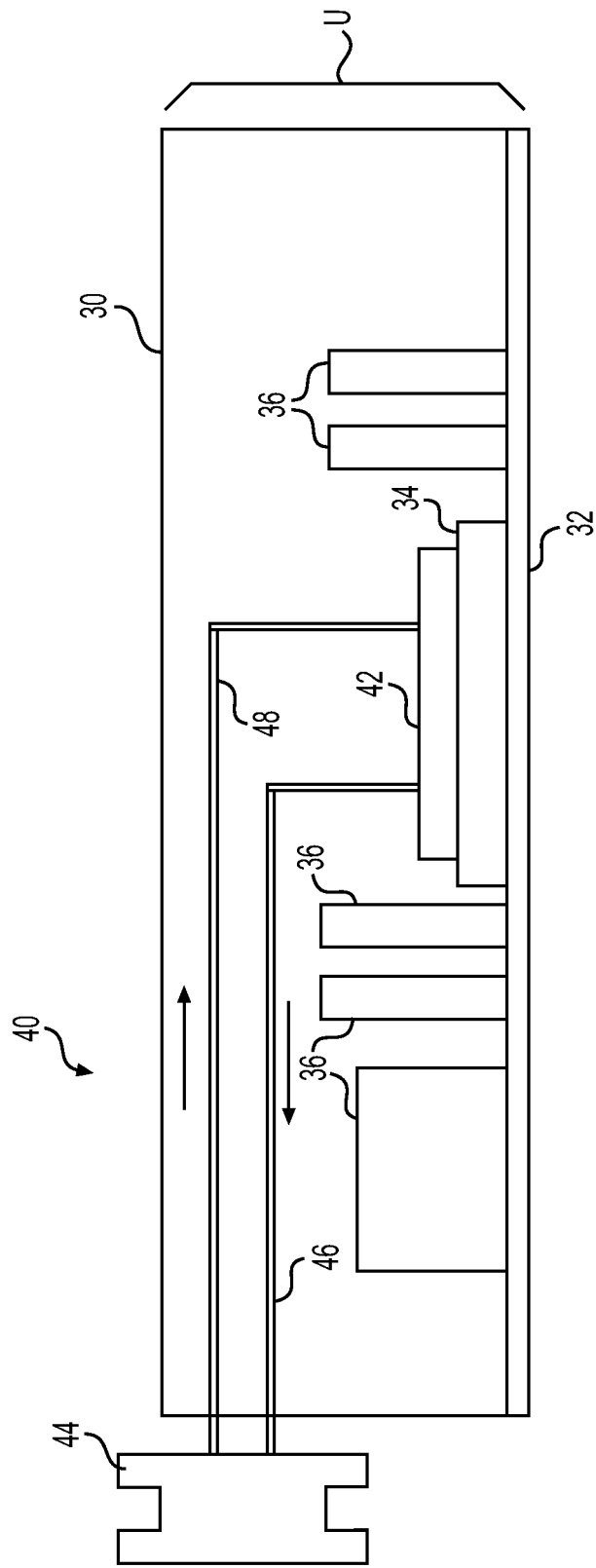
FIG. 5 is a front elevation view of the server, the evaporator and the condenser of FIG. 1 in accordance with an embodiment of the present technology.

FIG. 4 is a top plan view of a server, an evaporator and a condenser in accordance with an embodiment of the present technology. FIG. 5 is a front elevation view of the server, the evaporator and the condenser of FIG. 1 in accordance with an embodiment of the present technology. A server 30 comprises a plurality of components mounted on a printed circuit board (PCB) 32. At least one of these components is a heat-generating unit 34 of the server 30, for example a central processing unit (CPU) or a graphical processing unit (GPU). Although other components 36 of the server 30 are schematically illustrated, they are not related to the present cooling configuration and are not discussed further herein. The server 30 has a width 37 and a depth 38 and is adapted to fit within the stages 12 of the server rack 10, given their width 16 and their depth 18.

Figure 6B:
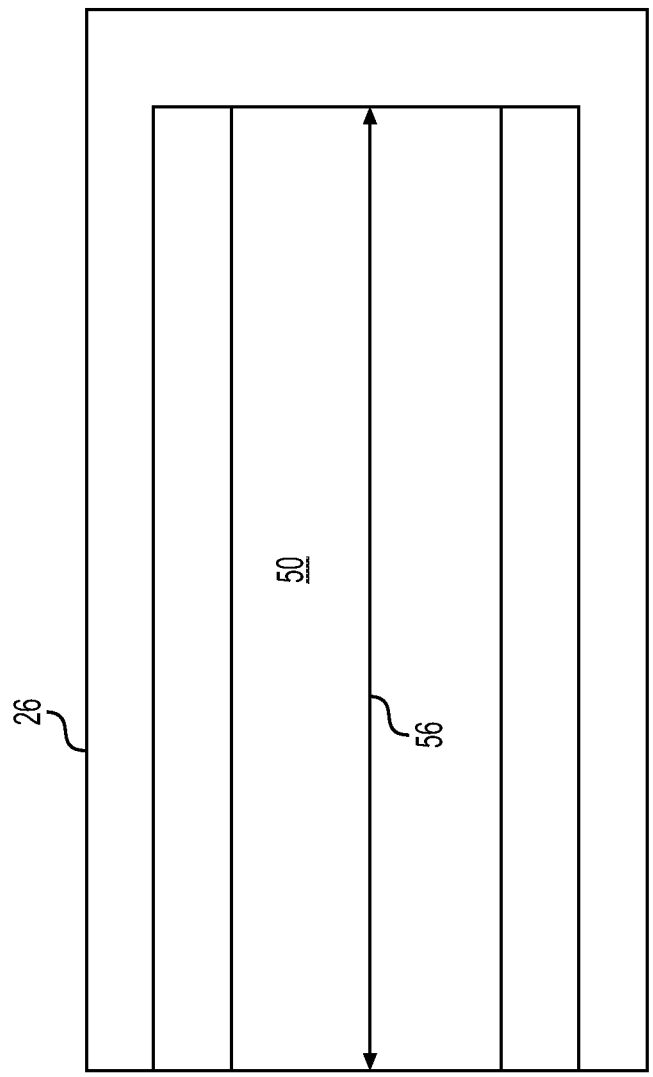
FIG. 6B is a left side elevation view of the heat transfer module of the fluid cooling unit in accordance with an embodiment of the present technology.
Figure 6A:
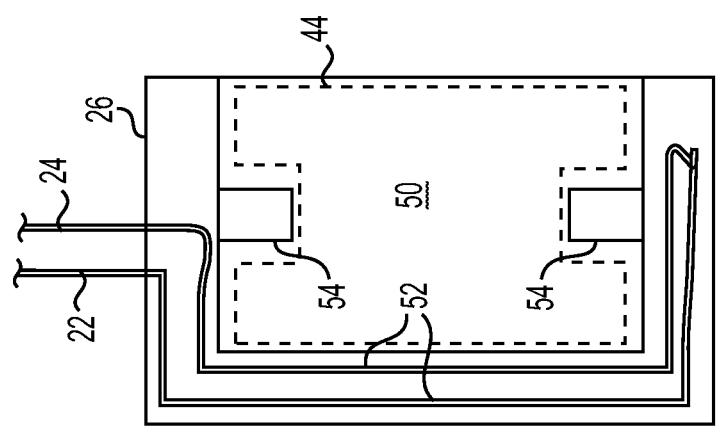
FIG. 6A is a front elevation view of a heat transfer module of the fluid cooling unit in accordance with an embodiment of the present technology.
Figure 7:
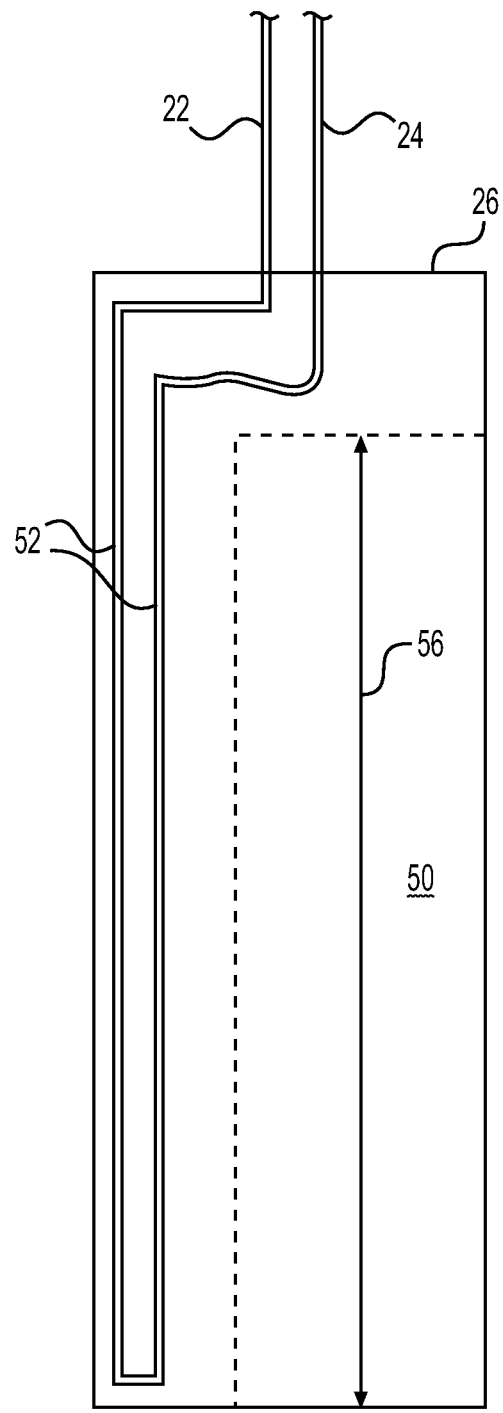
FIG. 7 is a top plan view of the heat transfer module of the fluid cooling unit in accordance with an embodiment of the present technology.

A cooling arrangement for the server 30 comprises a phase change device 40 including an evaporator 42, a condenser 44, and conduits 46 and 48. The evaporator 42 is mounted on a heat-generating unit 34 of the server 30. A thermal paste may be used to maximize a thermal contact between the heat-generating unit 34 and the evaporator. The conduit 46 extends laterally from the server 30 and transports a working fluid heated in the evaporator 42 to the condenser 44, located outside of the server rack 10. The conduit 48 also extends laterally from the server 30 and transports the working fluid cooled in the condenser 44 to the evaporator 42. Arrows next to the conduits 46 and 48 on FIGS. 4 and 5 illustrate flow directions of the working fluid. The server rack 10 may include, in each stage 12, a lateral slot (not shown) on the lateral side of the server rack 10 allowing the conduits 46 and 48 to protrude therethrough. A sealing gasket 14 may be provided along the lateral slot of each stage 12 to prevent the cooling fluid from accidentally entering the server rack 10. In an embodiment using heat pipes, the conduits 46 and 48 may be defined as inner cavities within common envelopes in the heat pipes FIG. 6A is a front elevation view of a heat transfer module of the fluid cooling unit in accordance with an embodiment of the present technology. FIG. 6B is a left side elevation view of the heat transfer module of the fluid cooling unit in accordance with an embodiment of the present technology. FIG. 7 is a top plan view of the heat transfer module of the fluid cooling unit in accordance with an embodiment of the present technology. As shown on FIGS. 6A, 6B and 7, an open channel 50 parallel to the lateral side of the server rack 10 is defined within the heat transfer module 26. The open channel 50 is opened on a lateral side of the heat transfer module 26 facing the lateral side of the server rack 10 so that the condenser 44 may be slidably received within the open channel 50 when the server 30 is inserted in the server rack 10 from a front side of the server rack 10, the conduits 46 and 48 being free to slide within the open side of the open channel 50. The open channel 50 is also opened on a front side thereof to allow insertion of the condenser 44. The open channel 50 may be closed (as illustrated on FIG. 7) or opened on a rear side thereof. A water jacket 52 extends between the fluid inlet 22 and the fluid outlet 24 of the fluid cooling unit 20. The water jacket 52 surrounds in whole or at least in part the open channel 50. The water jacket 52 may be formed as a chamber surrounding the open channel 50, or as one or more continuous conduits extending in a zigzag around the open channel 50. Regardless, the heat transfer module 20 allows a transfer of heat from the working fluid present in the condenser 44 to the cooling fluid present in the water jacket 52 when the condenser 44 is received in the open channel 50. It may be noted that the term "water jacket" is conventionally used to describe a void in a device in which a cooling fluid may flow. The use of the term "water jacket" is not meant to limit the present disclosure and cooling fluids other than water may flow within the water jacket 52.

The server rack 10 has a capability of receiving a plurality of servers 30. The cooling arrangement illustrated in the above-described Figures may thus include a plurality of phase change devices 40, each of which having a respective evaporator 42 for mounting on a heat-generating unit 34 of a respective server 30, respective conduits 46 and 48 transporting a working fluid between the respective evaporator 42 and a respective condenser 44. The respective condensers 44 are insertable in the open channels 50 of respective heat transfer modules 26 when the respective servers 30 are inserted in respective stages 12 of the server rack 10. Each heat transfer module 26 is similarly constructed, their respective open channels 50 receiving the respective condensers 44, each heat transfer module 26 further having and their respective water jackets 52.

FIG. 8 is schematic diagram of a manifold of the fluid cooling unit in accordance with an embodiment of the present technology. The fluid cooling unit 20 may include a manifold 60 to which the fluid inlet 22 and the fluid outlet 24 are connected. An internal conduit 62 connects the fluid inlet 22 to the water jacket 52 of each heat transfer module 26. Another internal conduit 64 connects the fluid outlet 24 to the water jacket 52 of each heat transfer module 26.

As illustrated on FIGS. 5 and 6A, in a non-limiting embodiment, the condenser 44 has a H-shaped cross-section defined perpendicularly from a direction of insertion of the server 30 in the server rack 10. In the same embodiment, the open channel 50 has C-shaped opening with top and bottom rails 54 protruding within the C-shaped opening. Considering FIG. 6A, the C-shaped opening of the open channel 50 with the top and bottom rails 54 are adapted to mate with the H-shaped cross-section of the condenser 44 when the condenser 44 is received in the open channel 50. Although FIG. 6A shows sizeable gaps between the condenser 44 and the edges of the open channel 50, the condenser 44 and the heat transfer module 26 may be shaped and dimensioned to provide a snug fit between these components to maximize heat transfer between the condenser 44 and the cooling fluid flowing in the water jacket 52. Other cross-sections of the condenser 44 and of the open channel 50 are also contemplated, for example by providing additional extensions similar to the rails 54 within the open channel 50 and providing corresponding grooves within the condenser 44.

In an embodiment, the heat transfer module 26 may be constructed of aluminum, copper, or another material having good thermal conductivity. In the same or another embodiment, a thermal paste may be preloaded in the open channel 50 or applied to the condenser 44 prior to its insertion in the open channel 50 in order to maximize heat transfer capability between the condenser 44 and the heat transfer module 26. In the same or another embodiment, a magnet may be used to facilitate a contact between the condenser 44 and the heat transfer module 26.

Returning to FIGS. 4 and 5, the evaporator 42 is placed in contact with a top surface of the heat-generating unit 34. A resulting contact surface is maximized when the area of the evaporator 42 matches the top surface of the heat-generating unit 34. In an embodiment, the evaporator 42 can absorb more heat from the heat-generating unit 34 than a comparatively sized water block or other water-cooling unit. When compared to water-cooling technology, the combination of the evaporator 42 and of the condenser 44 provides a much larger effective heat-absorbing surface when compared to a water block mounted on the same heat-generating unit 34. The working fluid in the components of the phase change device 40 may comprise, for example and without limitation, water, distilled water, ammonia, pentane, methanol, ethanol, butanol or hydrofluorocarbon.

Considering FIGS. 2 and 4, the server rack 10 has a defined depth 18, a maximum depth of the server 30 being defined accordingly. The open channel 50 within the fluid cooling unit 20 has a length 56 not exceeding the depth 18 of the server rack 50. The condenser 44 has a length 45 not exceeding the length 56 of the open channel 50. The length 45 of the condenser 44 and, conversely, the length 56 of the open channel 50 may be selected to be shorter than the depth 18 of the server rack 10. For a given cross-section of the condenser 44 and for given heat transfer characteristics of the combination of the condenser 44 and of the heat transfer module 26, an actual length 45 of the condenser 44 may be selected according to the cooling needs of the heat-generating unit 34 mounted in the server 30.

The above described cooling arrangement and configuration may be modified by placing a fluid cooling unit 20 on each lateral side of the server rack 10. In this configuration, each fluid cooling unit 20 comprises a number of heat transfer modules 26 distributed vertically along the respective lateral sides of the server rack 10. Two evaporators 40 mounted on the server 30 may be connected via respective pairs of conduits 46 and 48 to two condensers 44, one condenser 44 being slidably inserted in a respective heat transfer module 26 of each fluid cooling unit 20. The two evaporators 40 may be mounted on a same heat-generating unit 34 for redundancy purposes; likewise, the two fluid cooling units 20 may be fluidly connected to distinct external cooling facilities for added redundancy. The two evaporators 40 may alternatively be mounted on two distinct heat-generating units 34 of the same server 30, for example on a CPU and on a GPU of the server 30.

Redundancy may also be provided within a single fluid cooling unit 20. To this end, the fluid cooling unit 20 may comprise a first pair comprising one fluid inlet 22 and one fluid outlet 24 exchanging a cooling fluid with the external cooling facility, as well as a second pair comprising another fluid inlet 22 and another fluid outlet 24 exchanging a cooling fluid with the same external cooling facility or with another external cooling facility. Each heat transfer module 26 may include a pair of independent water jackets 52, one water jacket 52 being fluidly connected to the first pair first pair comprising the one fluid inlet 22 and the one fluid outlet 24 and another water jacket 52 being fluidly connected to the second pair comprising the other fluid inlet 22 and the other fluid outlet 24. In a given heat transfer module 26, the two independent water jackets 52 may extend side-by-side so that they both fully surround the open channel 50. Alternatively, the two independent water jackets 52 may each surround a part of the open channel 50.

FIG. 9 is a front elevation view of another heat transfer module of the fluid cooling unit and another condenser in accordance with an embodiment of the present technology. In a non-limiting embodiment, a condenser 44' is connected to the evaporator 42 as expressed hereinabove. The condenser 44' has a somewhat different, H-shaped cross-section when compared to that the condenser 44 as shown on FIG. 6A. A heat transfer module 26' also has a somewhat different C-shaped open channel 50' when compared to that of the heat transfer module 26 as shown on FIG. 6A. Other shapes of the condenser 44' and of the heat transfer module 26' are also contemplated. Other components of the heat transfer module 26' are similar to that of the heat transfer module 26, including a water jacket 52 (as shown in earlier Figures) connected to the fluid inlet 22 and to the fluid outlet 24 of the fluid cooling unit 20.

The heat transfer module 26' is surrounded on three faces, other than on a lateral side facing the lateral side of the server rack 10, by a casing 70 containing a phase change material (PCM). The casing 70 is thermally connected to the heat transfer module 26' and, either directly or indirectly thermally connected to the condenser 44'. The PCM may comprise, for example, paraffin wax, fatty acids, esters or salt hydrates. In the non-limiting embodiment as shown on FIG. 9, the condenser 44' is shaped with ends 72 that are proximally located to ends 74 of the casing 70 to provide a direct thermal contact between the condenser 44' and the casing 70.

Under normal operating conditions, heat transferred from the evaporator 42 to the condenser 44' is transferred to the cooling fluid normally flowing in the water jacket 52 of the heat transfer module 26'. The temperature of the heat transfer module 26' is below a phase change temperature of the PCM contained in the casing 70, which is maintained in a solid state at the time. When in the solid state, the PCM may be considered as being 'charged' in the sense that it is capable of absorbing thermal energy. Should delivery of the cooling fluid to the fluid cooling unit 20 as a whole or to the condenser 44' in particular stop or be constrained to a point where a lack of flow of the cooling fluid in the water jacket 52 causes the heat transfer capability of the heat transfer module 26' to no longer be sufficient to absorb the heat from the condenser 44', the resulting increase of temperature of the condenser 44' will cause the PCM contained in the casing 70 to gradually change from the solid state to a liquid state, becoming gradually 'discharged' as it absorbs heat from the condenser 44'. Provided that the flow of cooling fluid to the condenser 44' resumes before the entire PCM has changed to the liquid state, the temperature of the condenser 44' will remain at a safe level. A size of the casing 70 and the nature of the PCM are selected to provide a sufficient duration to allow an operator to solve the cooling fluid delivery problem.

For example and without limitation, in normal operation, a temperature of the conduit 46 leading to the condenser 44' may be at 40 degrees and a temperature of the cooling fluid in the heat transfer module 26' may be at 25 degrees. A PCM is selected so that its phase change temperature is 30 degrees. The PCM is normally maintained charged, in solid state, by the temperature of the cooling fluid flowing in the water jacket 52 of the heat transfer module 26'. Should the temperature of the heat transfer module 26' increase because of a lack of cooling fluid flow, the PCM will start absorbing heat from the condenser 44' and remain at 30 degrees until it is completely in the liquid state.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each and every embodiment of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A cooling arrangement for a server mountable in a server rack having a front side, a rear side, a bottom side, a top side, a first lateral side and a second lateral side opposite from the first lateral side, the cooling arrangement comprising:
    a phase change device, comprising:
        an evaporator adapted to be mounted on a heat-generating unit of the server,
        a condenser,
        a first conduit extending from the server to the first lateral side of the server rack, the first conduit being adapted to transport to the condenser a working fluid heated in the evaporator, and
        a second conduit extending from the server to the first lateral side of the server rack, the second conduit being adapted to return to the evaporator the working fluid cooled in the condenser; and
    a fluid cooling unit positioned along the first lateral side of the server rack, the fluid cooling unit comprising:
        a fluid inlet adapted to receive a cooling fluid from an external cooling facility,
        a fluid outlet adapted to return the cooling fluid to the external cooling facility, and
        a heat transfer module, comprising:
            an open channel parallel to the first lateral side of the server rack and adapted to slidably receive the condenser when the server is inserted in the server rack from a front side of the server rack, and
            a water jacket extending between the fluid inlet and the fluid outlet and surrounding at least in part the open channel,
        the heat transfer module being configured to allow a transfer of heat from the working fluid present in the evaporator to the cooling fluid present in the water jacket when the condenser is received in the open channel;
    the condenser having a H-shaped cross-section defined perpendicularly from a direction of insertion of the server in the server rack;
    the open channel having a C-shaped opening with top and bottom rails protruding within the C-shaped opening, the C-shaped opening and the top and bottom rails being adapted to mate with the H-shaped cross-section of the condenser when the condenser is received in the open channel.

2. The cooling arrangement of claim 1, further comprising a casing containing a phase change material, the casing being thermally connected to the heat transfer module and to the condenser, the PCM changing from a solid state to a liquid state when a lack of flow of the cooling fluid in the water jacket causes a temperature of the PCM to increase above a phase change temperature of the PCM, the PCM changing from the liquid state to the solid state when a normal flow of the cooling fluid in the water jacket causes a temperature of the PCM to decrease to less than the phase change temperature of the PCM.

3. The cooling arrangement of claim 1, further comprising:
    a plurality of phase change devices, each phase change device comprising:
        a respective evaporator adapted to be mounted on a heat-generating unit of a respective server,
        each phase change device further comprising a respective first conduit and a respective second conduit adapted to transport a working fluid between the respective evaporator and a respective condenser;
    wherein the fluid cooling unit further comprises:
        a plurality of heat transfer modules, each heat transfer module comprising a respective open channel being adapted to slidably receive a respective one of the condensers, and
        a respective water jacket extending between the fluid inlet and the fluid outlet.

4. The cooling arrangement of claim 3, wherein the plurality of heat transfer modules are vertically distributed along a lateral edge on the first lateral side of the server rack and adapted to receive the plurality of condensers in their respective open channels when the respective condensers of the plurality of phase change devices are mounted on a plurality of servers vertically distributed in the server rack.

5. The cooling arrangement of claim 3, wherein the fluid cooling unit further comprises a manifold connecting the fluid inlet and the fluid outlet to each of the water jackets.

6. The cooling arrangement of claim 1, wherein:
    the server rack has a depth;
    the open channel has a length not exceeding the depth of the server rack; and
    the condenser has a length not exceeding the length of the open channel.

7. The cooling arrangement of claim 1, wherein the first conduit and the second conduit are heat pipes.

8. The cooling arrangement of claim 1, wherein the first conduit and the second conduit are adapted to protrude through a lateral slot on the first lateral side of the server rack.

9. The cooling arrangement of claim 8, further comprising a sealing gasket positioned on a lateral edge on the first lateral side of the server rack, the sealing gasket being adapted to allow passage of the first conduit and the second conduit.

10. The cooling arrangement of claim 1, wherein the external cooling facility is a dry cooler.

11. The cooling arrangement of claim 1, wherein the working fluid is selected from water, distilled water, ammonia, pentane, methanol, ethanol, butanol and hydrofluorocarbon.

12. The cooling arrangement of claim 1, wherein:
    the fluid inlet is a first fluid inlet adapted to receive a first cooling fluid;
    the fluid outlet is a first fluid outlet adapted to return the first cooling fluid;
    the water jacket is a first water jacket;
    the external cooling facility is a first external cooling facility;
    the fluid cooling unit further comprises:
        a second fluid inlet adapted to receive a second cooling fluid from the first external cooling facility or from a second external cooling facility,
        a second fluid outlet adapted to return the second cooling fluid to the first external cooling facility or to the second external cooling facility, and a second water jacket extending between the second fluid inlet and the second fluid outlet and surrounding at least in part the open channel; and the heat transfer module is further configured to allow a transfer of heat from the working fluid present in the evaporator to the second cooling fluid present in the second water jacket when the condenser is received in the open channel.

13. A cooling arrangement, comprising:

a first combination comprising a first phase change device and a first fluid cooling unit as defined in claim 1, a first evaporator of the first combination being thermally coupled to a first heat-generating unit of the server; and a second combination comprising a second phase change device and a second fluid cooling unit as defined in claim 1, a second evaporator of the second combination being thermally coupled to the first heat-generating unit of the server or to a second heat-generating unit of the server;

wherein the first fluid cooling unit is positioned along the first lateral side of the server rack; and wherein the second fluid cooling unit is positioned along the second lateral side of the server rack.

\* \* \* \* \*